(12) United States Patent
Paek et al.

(10) Patent No.: US 7,973,400 B2
(45) Date of Patent: Jul. 5, 2011

(54) SEMICONDUCTOR PACKAGE HAVING IMPROVED HEAT SPREADING PERFORMANCE

(75) Inventors: Soo-Jin Paek, Gyeonggi-do (KR); Woo-Seop Kim, Seoul (KR); Ki-Sung Kim, Seoul (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 698 days.

(21) Appl. No.: 11/934,635

(22) Filed: Nov. 2, 2007

(65) Prior Publication Data
US 2008/0116557 A1 May 22, 2008

(30) Foreign Application Priority Data
Nov. 16, 2006 (KR) .................. 10-2006-0113408

(51) Int. Cl.
*H01L 23/373* (2006.01)

(52) U.S. Cl. .. 257/686; 257/706; 257/717; 257/E23.101

(58) Field of Classification Search .................. 257/686, 257/706–707, 717, E23.08, E23.101
See application file for complete search history.

(56) References Cited

U.S. PATENT DOCUMENTS
2003/0197260 A1* 10/2003 Nishimura et al. ........... 257/686
2005/0199993 A1* 9/2005 Lee et al. ..................... 257/686
2006/0006517 A1* 1/2006 Lee et al. ..................... 257/686

FOREIGN PATENT DOCUMENTS
| JP | 08-017975 | 1/1996 |
|---|---|---|
| JP | 2001-085603 | 3/2001 |
| JP | 2002-176135 | 6/2002 |
| KR | 2005-0090882 | 9/2005 |
| KR | 2006-0080420 | 7/2006 |

OTHER PUBLICATIONS

English language abstract of Japanese Publication No. 08-017975.
English language abstract of Japanese Publication No. 2001-085603.
English language abstract of Japanese Publication No. 2002-176135.
English language abstract of Korean Publication No. 2006-0080420.

* cited by examiner

*Primary Examiner* — Colleen A Matthews
(74) *Attorney, Agent, or Firm* — Muir Patent Consulting, PLLC

(57) ABSTRACT

A semiconductor package having a structure in which heat produced in the interior of the package is effectively spread to the outside of the package is provided. The semiconductor package includes one or more semiconductor chips, one or more substrates (PCBs) having the semiconductor chips respectively attached thereto, a plurality of conductive balls such as a plurality of solder balls to provide voltages and signals to the one or more semiconductor chips, and a heat sink positioned to spread heat produced in the interior of the package to the outside and directly connected to at least one of the plurality of solder balls.

15 Claims, 4 Drawing Sheets

SEMICONDUCTOR PACKAGE HAVING IMPROVED HEAT SPREADING PERFORMANCE

CROSS-REFERENCE TO RELATED PATENT APPLICATION

This application claims the benefit of Korean Patent Application No. 10-2006-0113408, filed on Nov. 16, 2006, in the Korean Intellectual Property Office, the disclosure of which is incorporated herein by reference.

BACKGROUND

1. Field of the Invention

The present invention relates to a semiconductor package, and more particularly, to a semiconductor package capable of effectively radiating heat produced in the interior thereof.

2. Description of the Related Art

As semiconductor packages having semiconductor chips mounted therein are highly integrated and operated at high speeds, their operation speeds have been greatly increased and their sizes have been reduced. This leads to higher temperatures in the packages, especially for multi chip packages (MCPs), which contain two or more chips in one package. High temperatures in the interior of a package can cause stress on the chips mounted in the package and often result in malfunctions. The operation speed of the chips is also reduced by high temperatures. Particularly, the refresh characteristics of DRAM semiconductor chip are degraded with high temperatures in the packages.

FIG. 1 shows the heat spreading path in a typical semiconductor package. The semiconductor package is illustrated as an example of a 1-chip 1-package having one semiconductor chip.

As shown in this figure, the typical semiconductor package 10 includes a semiconductor chip 11, a printed circuit board (PCB) 12, at least one solder ball 14 electrically connecting the semiconductor chip 11 to the PCB 12, and at least one solder ball 15 electrically connecting the semiconductor package 10 to the outside. The semiconductor package 10 is connected to a circuit board through the solder ball 15 to receive power and signals, which are required in the semiconductor chip 11, from the outside.

The arrows in this figure indicate heat spreading paths. The solid arrows indicate the paths along which heat spreads through air, and the dotted arrows indicate the paths along which heat is conducted through materials inside the semiconductor package to the outside.

As shown in this figure, heat is spread to the outside through both the air and the material inside the semiconductor package. Although heat produced in a semiconductor package is generally conducted through a board and effectively spread to the outside, only a small amount of heat is spread through the top of the package.

A conventional method of helping spread heat more efficiently is to attach a heat sink to the top surface of the semiconductor package in order to reduce the temperature inside the semiconductor package. FIG. 2 is a sectional view of a semiconductor package with a heat sink attached to the top surface of the semiconductor package.

As shown in FIG. 2, the semiconductor package 20 may include one or more semiconductor chips 22 and 23, substrates 24 and 25 each having a semiconductor chip stacked thereon, and one or more solder balls 27. A molding member 26 may be formed on the semiconductor package 20 to protect the semiconductor chips stacked inside the package. A heat sink 21 may be further attached to the top of the package to radiate heat produced in the package.

However, multi-chip semiconductor packages such as dual stack packages (DSPs) or quad stack packages (QSPs) produce a great amount of heat, but there is a limit to the amount of heat that can be radiated. Further, there is a problem in that internal chips of a multi-chip package may reach different temperatures, which may affect the reliability of the internal chips and the package as a whole.

SUMMARY

Embodiments of the present invention provide a semiconductor package having a structure that can effectively spread heat produced in the interior of the package.

According to an embodiment of the present invention a semiconductor package includes one or more semiconductor chips arranged in a stack structure, one or more substrates (PCBs) having the semiconductor chips respectively attached thereto, a plurality of solder balls providing voltages and signals to the one or more semiconductor chips, and a heat sink positioned to spread heat produced in the interior of the package to the outside and connected directly to at least one of the plurality of solder balls.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

The present invention will now be described more fully hereinafter with reference to the accompanying drawings, in which exemplary embodiments of the invention are shown. Like numbers refer to like elements throughout the specification.

Figure 1:
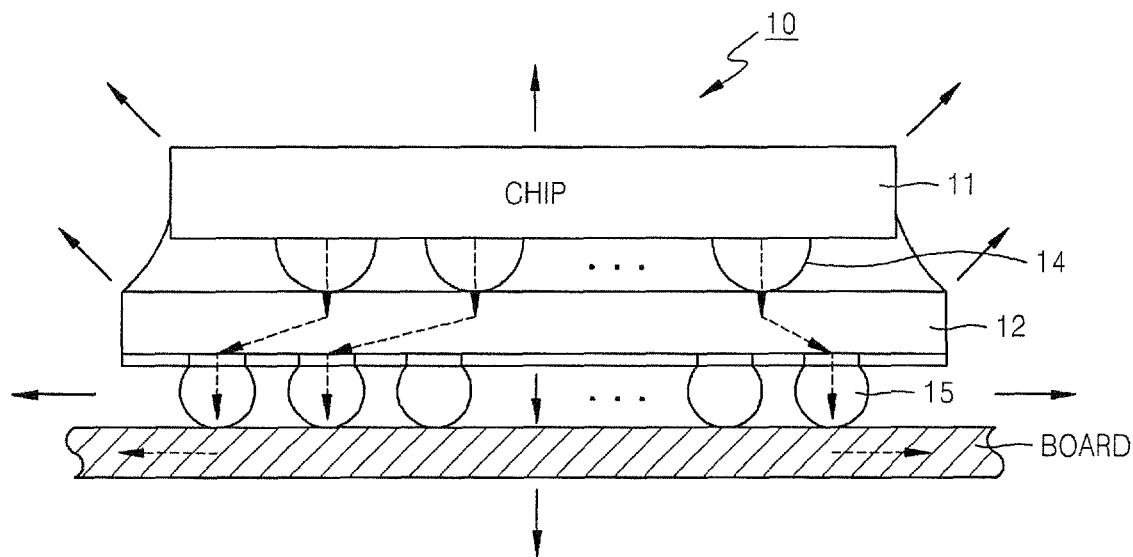
FIG. 1 shows the heat spreading path in a typical semiconductor package.
Figure 2:
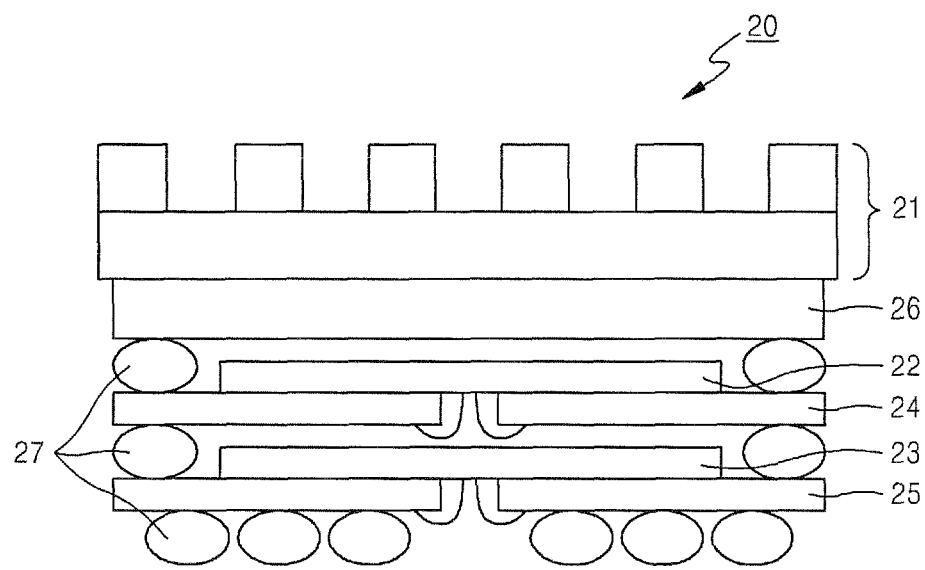
FIG. 2 is a sectional view of a conventional semiconductor package with a heat sink attached to a top thereof.
Figure 3:
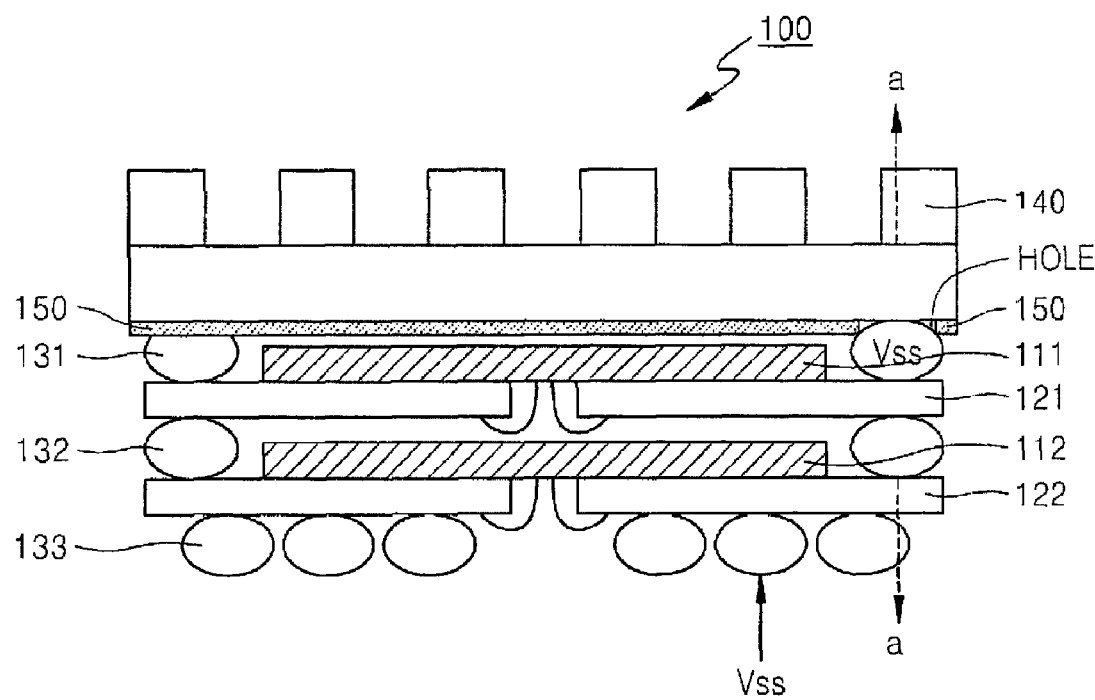
FIG. 3 is a sectional view showing a structure of a semiconductor package according to an embodiment of the present invention.

FIG. 3 is a sectional view of a semiconductor package according to an embodiment of the present invention. As shown in this figure, the semiconductor package 100 may include one or more semiconductor chips 111 and 112, one or more substrates (PCBs) 121 and 122, and a plurality of solder balls 131, 132, and 133.

In the semiconductor package 100 according to an embodiment of the present invention, one or more semiconductor chips may be arranged in a stack structure. As an example, semiconductor packages provided with a multi-chip structure, such as a dual stack package (DSP) and a quad stack package (QSP), may be applied. The semiconductor package shown in FIG. 3 includes two stacked semiconductor chips 111 and 112, as an example of a multi-chip package.

Each of the semiconductor chips may be attached to a substrate having a circuit pattern formed therein. As an example, the first semiconductor chip 111 is attached to the first substrate 121, and the second semiconductor chip 112 is attached to the second substrate 122.

Meanwhile, the plurality of solder balls 131, 132, and 133 are attached to the one or more substrates 121 and 122 to provide voltages and signals to the semiconductor chips 111 and 112. As an example, the solder balls 131 may be attached to the top surface of the first substrate 121, the solder balls 132 may be attached to the top surface of the second substrate 122, and the solder balls 133 may be attached to the bottom surface of the second substrate 122.

The semiconductor package 100 is connected to a main board (not shown) through the solder balls 133, and signals and power provided from the main board are transmitted to the respective semiconductor chips 111 and 112 through the substrates 121 and 122 having circuit patterns formed therein and the plurality of solder balls 131, 132, and 133.

Meanwhile, the semiconductor package 100 according to an embodiment of the present invention may further include a heat sink 140 for radiating heat produced in the package. The heat sink 140 is connected directly to at least one of the plurality of solder balls 131, 132, and 133. As an example, the heat sink 140 is connected directly to at least one of the plurality of solder balls 131 attached to the top surface of the first substrate 121.

A solder ball for transmitting a power voltage VDD or ground voltage VSS to the semiconductor chips 111 and 112 is connected to the heat sink 140. Since the transmission path of the power voltage VDD or ground voltage VSS is connected through the respective semiconductor chips 111 and 112 and the substrates 121 and 122, the heat sink 140 can be connected directly to the respective semiconductor chips 111 and 112 and the substrates 121 and 122. Accordingly, heat can be effectively spread. If the heat sink 140 is connected to a solder ball for providing a power voltage VDD, the power voltage VDD is exposed to the outside through the heat sink 140, which may cause problems. Thus, it may be preferable for the heat sink 140 to be connected to a solder ball providing a ground voltage VSS.

As the heat sink 140 is connected directly to at least one solder ball 131, particularly to a solder ball for providing a ground voltage VSS, the heat sink 140 forms a current path to the solder ball connected directly to the heat sink 140. That is, a current flows through the solder ball and the heat sink 140, so that all heat generated by this current can be spread directly to the outside through the heat sink 140.

Meanwhile, unlike the conventional package having a molding unit formed on the top thereof, the semiconductor package 100 according to an embodiment of the present invention may further include an insulating layer 150 positioned above the semiconductor chips 111 and 112 and the substrates 121 and 122 in order to protect a circuit in the package. More specifically, the insulating layer 150 may be attached between the solder balls 131 on the top surface of the first substrate 121 and the heat sink 140.

In order to allow the heat sink 140 to be connected directly to the solder balls 131 as described above, at least one hole is formed in the insulating layer 150. The hole is aligned with the solder ball for providing a ground voltage on the top of the first substrate 121. Although a solder ball for providing a ground voltage among the plurality of solder balls 131 is connected directly to the heat sink 140 as shown in this figure, the direct connection of the other solder balls to the heat sink 140 may be blocked by the insulating layer 150.

Figure 4A:
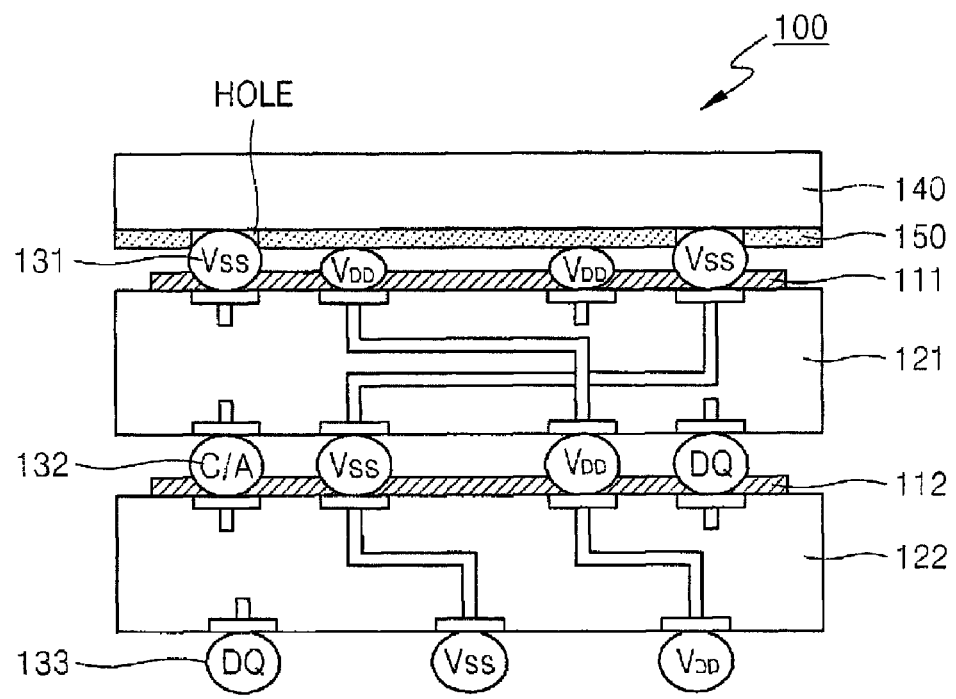
FIG. 4A is a sectional view of the semiconductor package taken along line a-a' of FIG. 3.
Figure 4B:
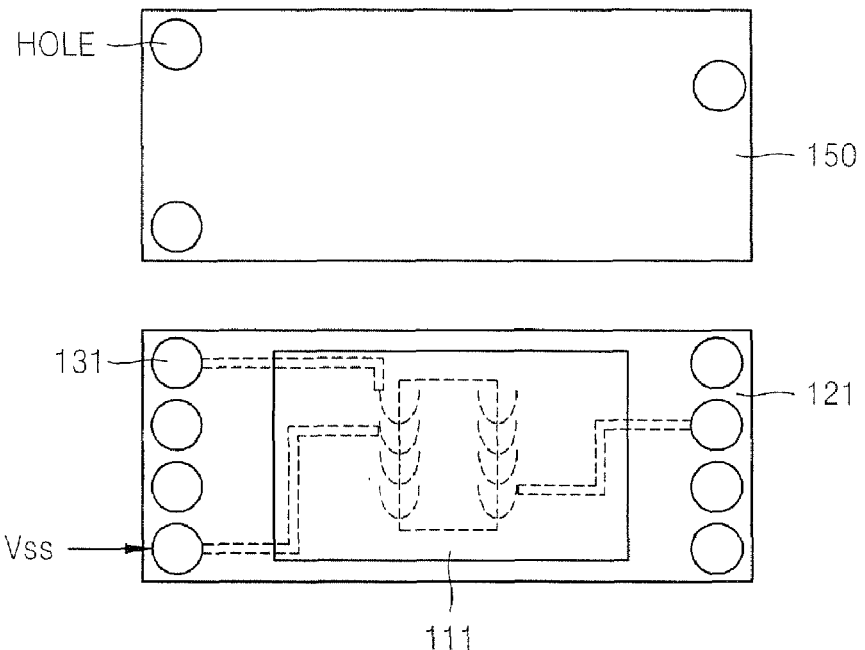
FIG. 4B is a plan view showing an insulating layer and a substrate illustrated in FIG. 3.

FIG. 4A is a section view of the semiconductor package taken along line a-a' of FIG. 3, and FIG. 4B is a plan view showing an insulating layer and a substrate illustrated in FIG. 3.

The sectional view with a shape shown in FIG. 4A may be conceived by vertically cutting the semiconductor package in the direction a-a' and then rotating it by 90 degrees. As shown in FIG. 4A, the first and second semiconductor chips 111 and 112 are attached respectively to the first and second substrates 121 and 122. The solder balls 131 may be attached to the top surface of the first substrate 121, the solder balls 132 may be attached to the top surface of the second substrate 122, and the solder balls 133 may be attached to the bottom surface of the second substrate 122.

The solder balls for providing a ground voltage VSS may be electrically connected to one another through circuit patterns formed in the substrates 121 and 122. Similarly, the solder balls for providing a power voltage VDD may be electrically connected to one another through circuit patterns formed in the substrates 121 and 122. The heat sink 140 is positioned on the top of the semiconductor package, and connected directly to the solder balls for providing a ground voltage VSS, which are attached to the top surface of the first substrate 121.

Meanwhile, the insulating layer 150 is positioned between the heat sink 140 and the solder balls 131 attached to the top surface of the first substrate 121. One or more holes are formed in the insulating layer 150, and are respectively aligned with one or more of the solder balls 131 providing a ground voltage VSS. The heat sink 140 is connected directly to the solder ball providing a ground voltage VSS through the hole. Accordingly, a current path is formed through the semiconductor chips 111 and 112, the substrates 121 and 122, and the heat sink 140.

FIG. 4B is a plan view showing the insulating layer 150 and the first substrate 121. As shown in this figure, one or more holes are formed in the insulating layer 150. The first semiconductor chip 111 is attached to one surface of the first substrate 121, and one or more solder balls 131 are attached to the top surface of the first substrate 121. One or more of the plurality of solder balls 131 may provide a ground voltage VSS, and the one or more holes may be respectively aligned with the one or more solder balls providing the ground voltage VSS.

Figure 5:
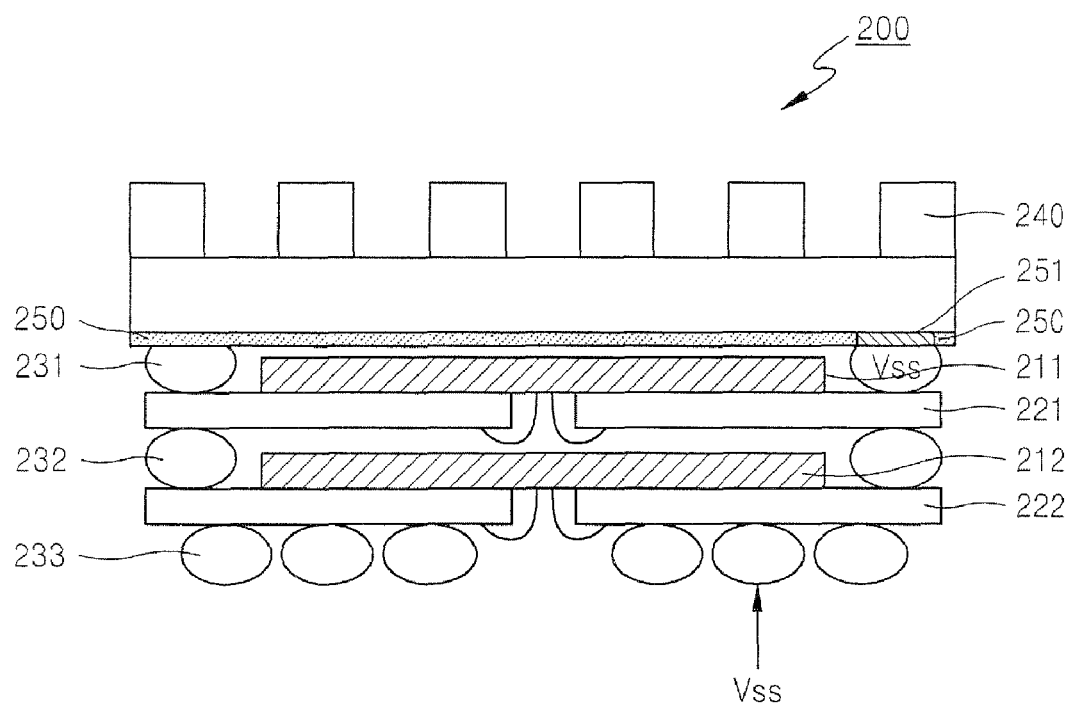
FIG. 5 is a sectional view of a semiconductor package according to an embodiment of the present invention.

FIG. 5 is a sectional view of a semiconductor package according to an embodiment of the present invention. The semiconductor package 200 may include one or more semiconductor chips 211 and 212 arranged in a stack structure, and respectively mounted on one or more substrates 221 and 222. Further, the semiconductor package 200 may further include one or more solder balls 231, 232, and 233 for providing voltages and signals from the outside to the semiconductor chips 211 and 212, a heat sink 240 for radiating heat produced in the package to the outside, and an insulating layer 250 positioned between the heat sink 240 and the solder balls 231 attached to the top surface of the first substrate 221.

In this embodiment, unlike an insulating layer having at least one hole, the insulating layer 250 has a conductive layer 251 aligned with at least one of the plurality of the solder balls 231. Preferably, the conductive layer 251 is aligned with a solder ball providing a voltage (VDD or VSS) attached to the top surface of the first substrate 221. As described above, it is preferred that the conductive layer 251 is aligned with one or more solder balls providing a ground voltage VSS.

According to the configuration described above, the heat sink 240 is electrically connected to the one or more solder balls providing a ground voltage VSS. The heat sink 240 is electrically connected to the semiconductor chips and the substrates through the conductive layer 251. Heat produced by a current is spread through the heat sink 240. Accordingly, heat produced in the package can be much more effectively spread to the outside compared with a structure in which a heat sink is connected to the top of a molding material.

Figure 6:
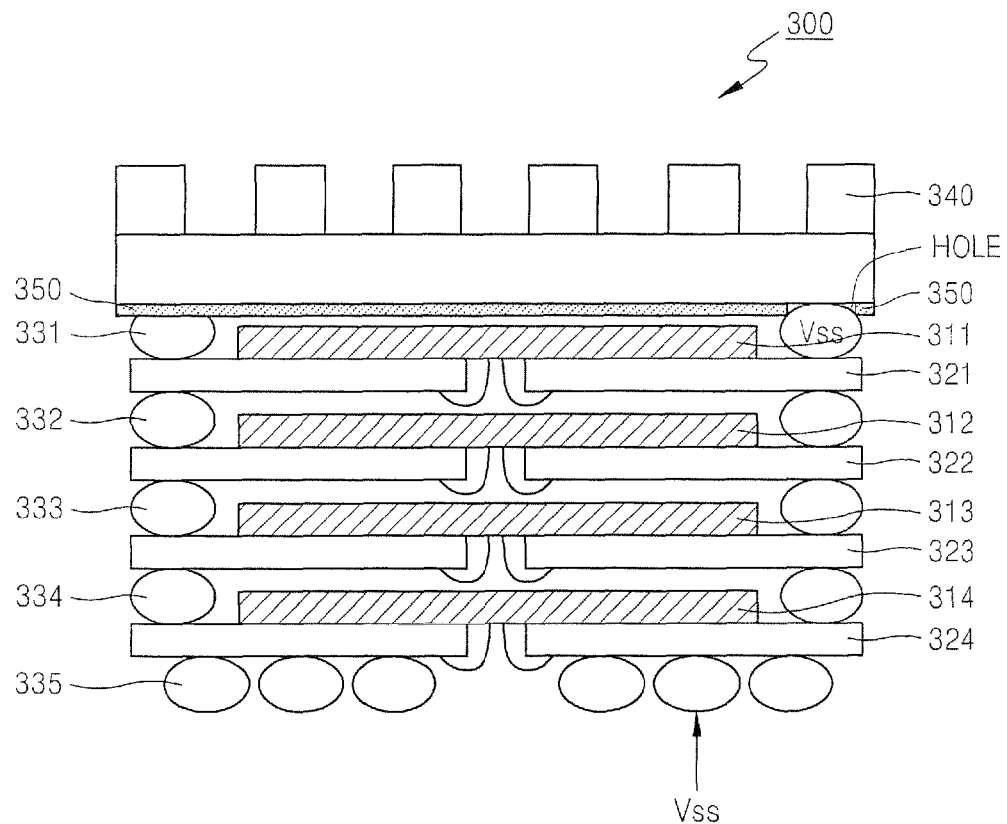
FIG. 6 is a sectional view showing a semiconductor package provided with a quad stack package (QSP) structure according to an embodiment of the present invention.

FIG. 6 is a sectional view of a semiconductor package having a quad stack package (QSP) structure according to an embodiment of the present invention. As shown in this figure, the semiconductor package 300 provided with a QSP structure includes four semiconductor chips 311 to 314, respectively mounted on four substrates 321 to 324.

A plurality of solder balls 331 to 335 for transmitting signals and voltages are attached respectively to top surfaces of the respective substrates 321 to 324 (except for solder balls 335, which are formed on the lower surface of substrate 324), and a heat sink 340 for radiating heat produced in the package is positioned above the first substrate 321. An insulating layer 350 is positioned between the solder balls 331 attached to the top surface of the first substrate 321 and the heat sink 340. One or more holes may be formed in the insulating layer 350 to allow the heat sink 340 to be connected directly to the solder balls 331. Preferably, the hole may be aligned with at least one solder ball transmitting a ground voltage, among the plurality of solder balls 331.

Meanwhile, although not shown in this figure, the insulating layer 350 may include a conductive layer formed in at least one position so as to allow the solder ball 331 and the heat sink 340 to be electrically connected to each other through a conductive material. In the case of the configuration described above, the insulating layer 350 may be coated on the top of the package during the manufacturing the semiconductor package and the heat sink may be attached in a later process. An additional heat sink may be attached to the top surface of the insulating layer 350, as well.

Figure 7:
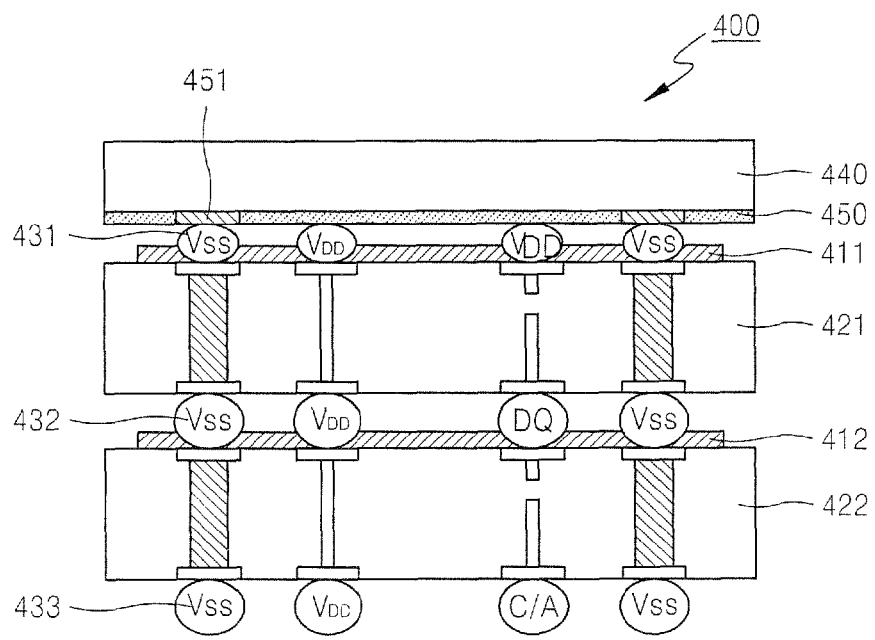
FIG. 7 is a sectional view of a semiconductor package according to an embodiment of the present invention.

FIG. 7 is a sectional view of a semiconductor package according to an embodiment of the present invention. As an example, the semiconductor package 400 includes two semiconductor chips 411 and 412, respectively mounted on two substrates 421 and 422. The two substrates 421 and 422 may have substantially the same structure. However, in other embodiments, additional semiconductor chips and substrates may be included in the package.

At least one via is formed in each of the substrates 421 and 422. Particularly, the via is aligned with a solder ball providing a ground voltage, among a plurality of solder balls 431, 432 and 433 providing signals and voltages to the semiconductor chips 411 and 412.

Meanwhile, a heat sink 440 is attached to the top of the package, and an insulating layer 450 is attached between the heat sink 440 and the solder balls 431 on the top surface of the substrate 421 stacked in an upper portion of the package. The insulating layer 450 may have conductive layers 451 aligned with the one or more solder balls providing a ground voltage VSS and the one or more vias. Further, holes may be formed instead of the conductive layers 451 as described above, so that the heat sink 440 can be connected directly to the solder balls. According to the configuration described above, heat produced in the semiconductor package can be effectively spread to the outside, and the temperature difference between semiconductor chips can be reduced.

As described above, since a semiconductor package according to the present invention has a structure in which a heat sink, a semiconductor chip, and a substrate are electrically connected to one another, there is an advantage in that heat produced in the semiconductor package can be effectively spread.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor package, comprising:
   one or more semiconductor chips arranged in a stack structure;
   one or more substrates including the one or more semiconductor chips respectively attached thereto;
   a plurality of solder balls arranged to provide voltages and signals to the one or more semiconductor chips, wherein at least a first solder ball of the plurality of solder balls is attached to an upper positioned substrate of the one or more substrates;
   a heat sink positioned to spread heat produced in the interior of the package to the outside, the heat sink directly connected to at least the first solder ball of the plurality of solder balls, wherein and an upper positioned chip of the one or more semiconductor chips is positioned between the upper positioned substrate and the heat sink; and
   an insulating layer positioned between the upper positioned substrate and the heat sink and attached to the heat sink, wherein the insulating layer includes at least a first hole through which the first solder ball connects to the heat sink,
   wherein at least a second solder ball of the plurality of solder balls is attached to the upper positioned substrate, and wherein the insulating layer positioned between the upper positioned substrate and the heat sink blocks the second solder ball from electrically connecting to the heat sink.

2. The semiconductor package of claim 1, wherein the first solder ball provides a ground voltage to the upper positioned semiconductor chip.

3. The semiconductor package of claim 1, wherein at least two of the plurality of solder balls are attached to each of the one or more substrates.

4. The semiconductor package of claim 1, wherein the insulating layer includes a plurality of holes through which solder balls pass in order to connect directly to the heat sink.

5. The semiconductor package of claim 4, wherein the first hole in the insulating layer is aligned with the first solder ball to provide a ground voltage to the upper positioned semiconductor chip.

6. The semiconductor package of claim 1, wherein the stack structure includes a plurality of semiconductor chips and a plurality of substrates.

7. The semiconductor package of claim 6, wherein the stack structure includes at least four semiconductor chips and at least four substrates.

8. A semiconductor package, comprising:
   a first substrate having a first surface and a second surface opposite the first surface, the first substrate including first wiring patterns;
   a first plurality of solder balls connected to the second surface of the first substrate and electrically connected to the first wiring patterns;
   a first semiconductor chip mounted on the first surface of the first substrate and electrically connected to the first wiring patterns;

a second plurality of solder balls connected to the first surface of the first substrate and electrically connected to the first wiring patterns;

a second substrate disposed over the first substrate and connected to the second plurality of solder balls, the second substrate having a first surface and second surface opposite the first surface, wherein the second substrate includes second wiring patterns electrically connected to the second plurality of solder balls;

a second semiconductor chip mounted on the first surface of the second substrate and electrically connected to the second wiring patterns;

an upper plurality of solder balls disposed over the first surface of the second substrate and electrically connected to the second wiring patterns;

a heat sink disposed over the upper plurality of solder balls disposed over the first surface of the second substrate, wherein the heat sink is electrically connected to at least a first solder ball of the upper plurality of solder balls, wherein no additional substrates are located between the heat sink and the upper plurality of solder balls disposed over the first surface of the second substrate; and an insulating layer disposed between the heat sink and the upper plurality of solder balls, the insulating layer being attached to the heat sink and including at least a first hole through which the first solder ball connects to the heat sink, wherein at least a second solder ball of the upper plurality of solder balls is blocked by the insulating layer from electrically connecting to the heat sink.

9. The semiconductor package of claim 8, wherein the heat sink is directly connected to the first solder ball through the first hole in the insulating layer.

10. The semiconductor package of claim 8, wherein the insulating layer includes at least one conductive layer respectively electrically connecting the heat sink with at least one of the upper plurality of solder balls.

11. The semiconductor package of claim 8, wherein the first and second wiring patterns each include vias.

12. The semiconductor package of claim 8, further comprising:

third and fourth semiconductor chips respectively mounted on third and fourth substrates respectively having third and fourth wiring patterns;

the first plurality of solder balls mounted between the first and third substrates, the first plurality of solder balls electrically connected to the first and third wiring patterns; and a third plurality of solder balls mounted between the third and fourth substrates, the third plurality of solder balls electrically connected to the third and fourth wiring patterns.

13. The semiconductor package of claim 8, wherein at least the first solder ball is connected to a ground voltage.

14. The semiconductor package of claim 8, wherein the heat sink is configured to dissipate heat generated in the package and conducted to the heat sink through the first, second, and upper plurality of solder balls and the first and second wiring patterns.

15. A semiconductor package, comprising:

one or more semiconductor chips;

one or more substrates having the one or more semiconductor chips respectively attached thereto;

a plurality of conductive balls arranged to provide voltages and signals to the one or more semiconductor chips, wherein at least a first conductive ball of the plurality of conductive balls is attached to an upper positioned substrate of the one or more substrates;

a heat sink directly connected to at least the first conductive ball to spread heat produced in the interior of the package to the outside; and an insulating layer attached to the heat sink and including at least a first hole through which the first conductive ball connects to the heat sink, wherein at least a second conductive ball of the plurality of conductive balls is attached to the upper positioned substrate, and wherein the insulating layer blocks the second conductive ball from electrically connecting to the heat sink.

* * * * *